United States Patent
Arai et al.

(10) Patent No.: US 7,238,563 B2
(45) Date of Patent: Jul. 3, 2007

(54) SEMICONDUCTOR DEVICE HAVING ISOLATION REGION AND METHOD OF MANUFACTURING THE SAME

(75) Inventors: Norihisa Arai, Saitama (JP); Takeshi Nakano, Kamakura (JP); Koki Ueno, Yokohama (JP); Akira Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/793,923

(22) Filed: Mar. 8, 2004

(65) Prior Publication Data

US 2004/0232514 A1    Nov. 25, 2004

(30) Foreign Application Priority Data

Mar. 10, 2003    (JP) .............................. 2003-063735

(51) Int. Cl.
H01L 21/336    (2006.01)

(52) U.S. Cl. ....................... 438/217; 438/289; 438/298; 438/E21.558

(58) Field of Classification Search ................ 438/217, 438/276, 289, 291, 298; 257/E21.043, E21.558, 257/E21.551, E21.557

See application file for complete search history.

(56) References Cited

U.S. PATENT DOCUMENTS

| 5,524,165 | A |   | 6/1996  | Labeye et al.        |
|-----------|---|---|---------|----------------------|
| 5,862,288 | A |   | 1/1999  | Tayag et al.         |
| 6,111,295 | A | * | 8/2000  | Arai ............ 257/392 |
| 6,165,825 | A | * | 12/2000 | Odake ........... 438/217 |
| 6,461,921 | B1| * | 10/2002 | Arai ............ 438/298 |
| 7,064,399 | B2| * | 6/2006  | Babcock et al. ... 257/408 |
| 2004/0232514 | A1 |   | 11/2004 | Arai et al. |

FOREIGN PATENT DOCUMENTS

| JP | 9-139382  | 5/1997  |
| JP | 9-322348  | 12/1997 |
| JP | 2002-9173 | 1/2002  |

OTHER PUBLICATIONS

U.S. Appl. No. 11/392,562, filed Mar. 30, 2006, Ueno.

* cited by examiner

*Primary Examiner*—Minh-Loan Tran
(74) *Attorney, Agent, or Firm*—Oblon, Spivak, McClelland, Maier & Neustadt, P.C.

(57) ABSTRACT

A trench isolation region is formed in a surface region of a semiconductor substrate to form a MOS type element region. A mask layer having an opening portion is formed on the semiconductor layer, the opening portion continuously ranging on the entire surface of the MOS type element region and on part of the trench isolation region provided around the MOS type element region. A first impurity ion is implanted into the entire surface via the mask layer to form a peak of the impurity profile is situated in the semiconductor layer under the bottom surface of the shallow trench isolation region. A second impurity ion is implanted into the entire surface via the mask layer to form a peak of the impurity profile is situated on the midway of the depth direction of the trench isolation region. Then, the first and second impurity ions are activated.

17 Claims, 7 Drawing Sheets

SEMICONDUCTOR DEVICE HAVING ISOLATION REGION AND METHOD OF MANUFACTURING THE SAME

CROSS-REFERENCE TO RELATED APPLICATIONS

This application is based upon and claims the benefit of priority from the prior Japanese Patent Application No. 2003-063735, filed Mar. 10, 2003, the entire contents of which are incorporated herein by reference.

BACKGROUND OF THE INVENTION

1. Field of the Invention

The present invention relates to a semiconductor device and a method of manufacturing the same. In particular, the present invention relates to a semiconductor device having an insulating gate field effect transistor (MOSFET) isolated by isolation region, and to a method of manufacturing the same.

2. Description of the Related Art

In semiconductor devices, for example, non-volatile semiconductor memory devices, the following technique is employed in order to realize micro isolation. According to the technique, the same conductivity type impurity as a substrate is passed through STI, and introduced into the substrate under the bottom surface of the STI. By doing so, a channel stopper region is formed thereon.

FIG. 1 is a flowchart to explain the process of manufacturing a MOSFET in a conventional semiconductor device. FIG. 2A and FIG. 2B are cross-sectional views showing the manufacturing process corresponding to the flowchart of FIG. 1

The process of manufacturing the conventional semiconductor device will be briefly described below with reference to FIG. 1 and FIG. 2. As shown in FIG. 2A, shallow trench isolation (STI) 11 is formed in a surface region of a semiconductor substrate 10. A resist layer 13 having a first opening is formed on the semiconductor substrate 10 by photo engraving process (PEP). Impurity ion implantation (first-time PEP channel ion implantation (I/I)) for depression type NMOSFET threshold voltage control is carried out using the resist layer 13 as a mask.

The resist layer 13 used in the process of FIG. 2A is removed (etched). As illustrated in FIG. 2B, a resist layer 15 having several second openings 14 is newly formed on the substrate 10 by the PEP. Thereafter, impurity ion implantation (second-time PEP field ion implantation (I/I)) is carried out using the resist layer 13 as a mask. The impurity ion implantation is carried out in order to form a channel stopper region at the semiconductor substrate 10 under the bottom surface of the STI 11.

According to the conventional technique, the PEP is separately carried out to form individual resist layers used for channel and filed implantations, as seen from the foregoing explanation. For this reason, the number of times for forming and removing the resist layer by the PEP increases. In order to satisfy the needs of high density and high function of elements, several MOSFETs having different threshold voltage are formed in the same substrate. In this case, the PEP for forming individual resist layers used for channel and filed implantations must be separately carried out every MOSFET group having different threshold voltage. This is a factor of increasing the manufacture cost, in particular.

Incidentally, JPN. PAT. APPLN. KOKAI Publication No. 9-322348 discloses the following technique. According to the technique, the same conductivity type impurity as a substrate and the opposite conductivity type impurity are introduced into the substrate under the bottom surface of STI through the STI.

According to the conventional technique, the PEP is separately carried out to form individual resist layers used for channel and filed implantations, as described above. For this reason, there is conventionally a problem of increasing the manufacture cost; therefore, it is desired to solve the foregoing problem.

BRIEF SUMMARY OF THE INVENTION

According to an aspect of the present invention, there is provided a method of manufacturing a semiconductor device, comprises:

forming an isolation region in a surface region of a first conductivity type semiconductor layer to form a MOS type element region having the semiconductor layer surrounded by the isolation region;

forming a mask layer having an opening portion on the semiconductor layer, the opening portion continuously ranging on the entire surface of the MOS type element region and on part of the isolation region provided around the MOS type element region;

implanting a first impurity ion into the entire surface using the mask layer as a mask to set a peak of the impurity profile is situated in the semiconductor layer under the bottom surface of the isolation region;

implanting a second impurity ion into the entire surface using the mask layer as a mask to set a peak of the impurity profile is situated on the midway of the depth direction of the isolation region; and activating the first and second impurity ions.

According to another aspect of the present invention, there is provided a semiconductor device comprises:

first and second element regions isolated by isolation regions formed in a semiconductor layer;

first and second MOS transistors formed in the first and second element regions, and provided with source and drain regions, one source region and the other drain region being used in common, the first MOS transistor having a first gate electrode provided with a first gate insulating film having a first thickness, the second MOS transistor having a second gate electrode provided with a second gate insulating film having a second thickness thinner than the first thickness;

a first channel stopper region formed under the isolation region, the first channel stopper region being separated from the source and drain region of the first MOS transistor; and a second channel stopper region formed under the isolation region, the second channel region being situated adjacent to the source and drain region of the second MOS transistor.

DETAILED DESCRIPTION OF THE INVENTION

Embodiments of the present invention will be described below with reference to the accompanying drawings.

First Embodiment

In the first embodiment, the case of manufacturing the following semiconductor device will be given as one example. In the semiconductor device, enhancement type (hereinafter, referred to as E-type) NMOSFET and depression type (hereinafter, referred to D-type) NMOSFET are formed in the same substrate.

Figure 1:
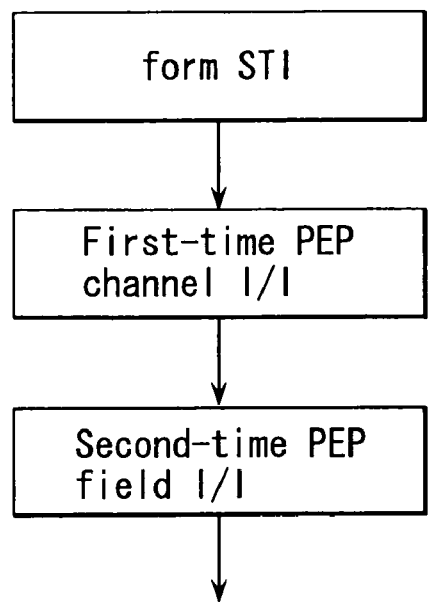
FIG. 1 is a flowchart to explain the process of manufacturing a MOSFET in a conventional semiconductor device.
Figure 2A:
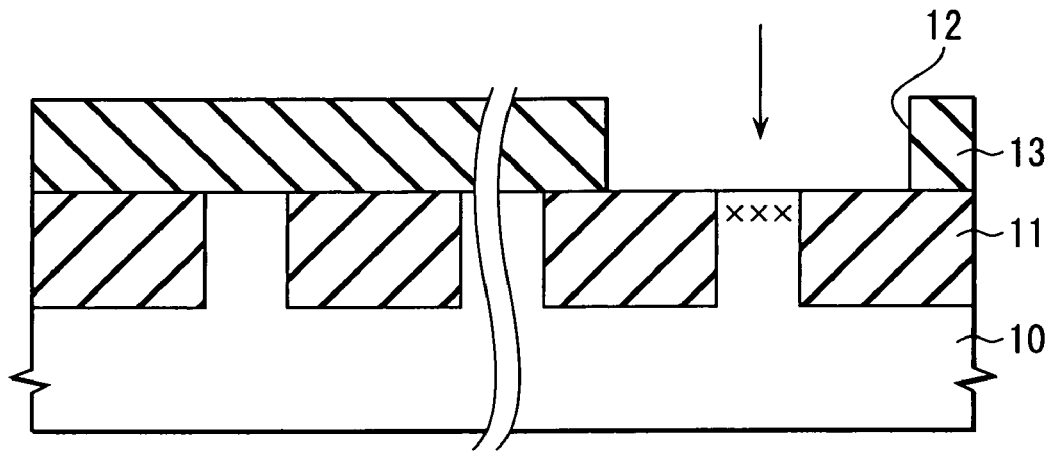
FIG. 2A and FIG. 2B are cross-sectional views showing the manufacturing process corresponding to the flowchart of FIG. 1.
Figure 2B:
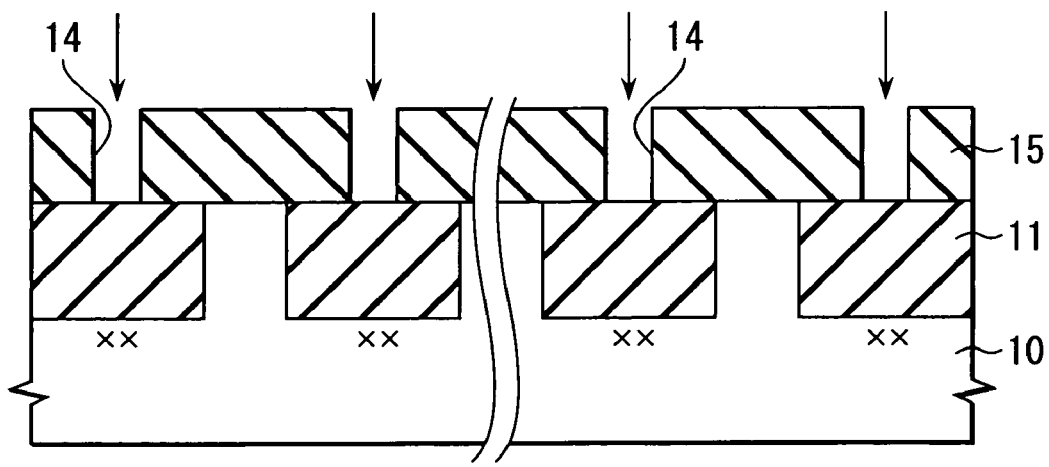
Figure 3A:
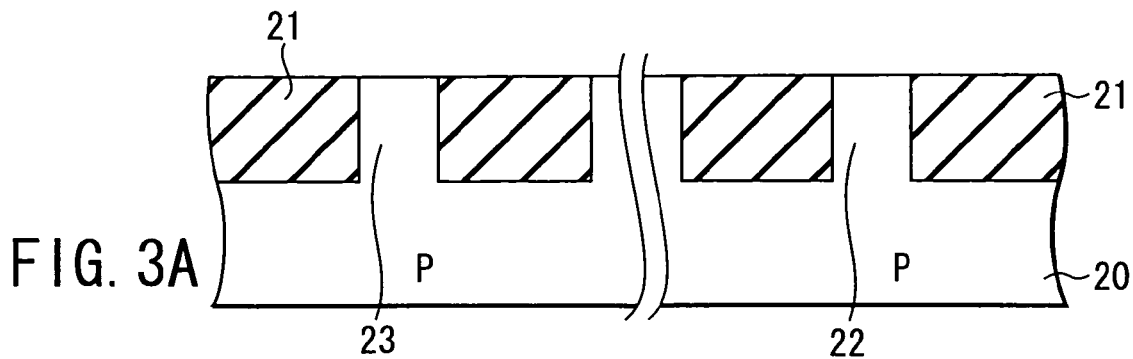
FIG. 3A to FIG. 3D are cross-sectional views showing the process of manufacturing a semiconductor device according to a first embodiment of the present invention.

As shown in FIG. 3A, a surface region of a P-type semiconductor substrate (semiconductor layer) 20 is formed with shallow trenches. An insulating film, for example, silicon oxide film ($SiO_2$ film) is deposited on the entire surface so that the trenches can be filled with the insulating film. The insulating film is removed by chemical and mechanical polishing (CMP), and thereby, the surface is planarized. By doing so, several STIs 21 having trenches filled with the insulating film are formed. The right half of FIG. 3A shows a state that a D-type NMOSFET region 22 having the substrate 20 surrounded by the STI 21. On the other hand, the left half of FIG. 3A shows a state that an E-type NMOSFET region 23 having the substrate 20 surrounded by the STI 21.

Figure 3B:
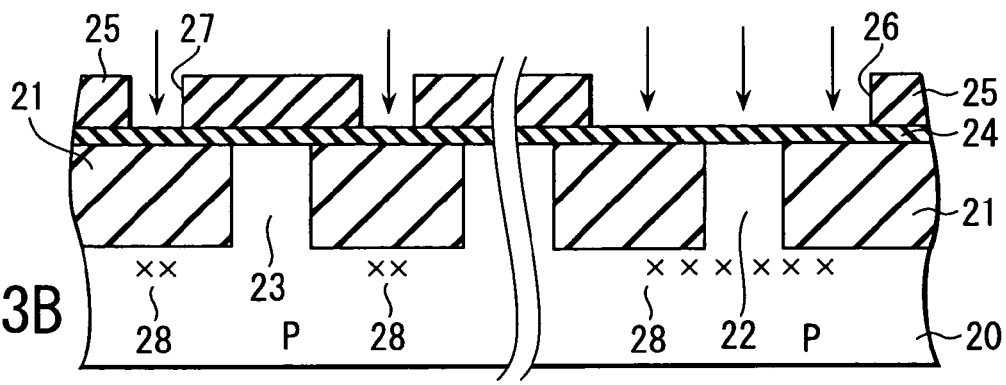
Figure 4:
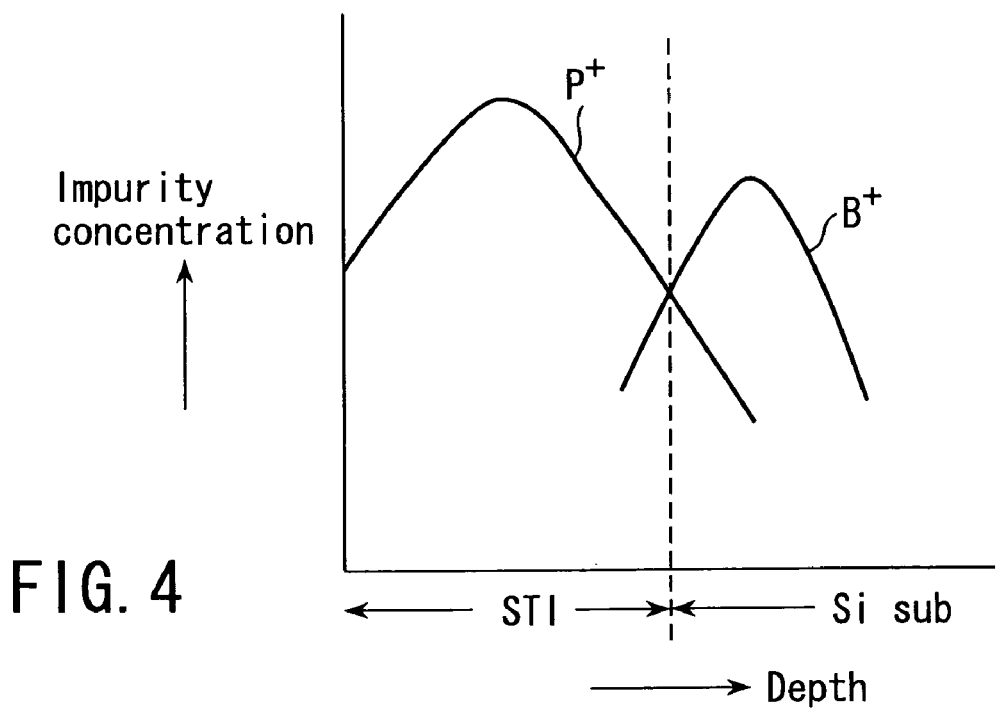
FIG. 4 is a graph to explain the impurity profile characteristic in the depth direction of STI and the bottom portion under the STI in the semiconductor device formed via the processes shown in FIG. 3A to FIG. 3D.

As illustrated in FIG. 3B, a buffer insulating film, for example, silicon oxide film 24 is deposited on the entire surface. Thereafter, an ion implantation mask is formed on the silicon oxide film 24 by the PEP. In this case, a resist layer 25 is formed as the ion implantation mask. The resist layer 25 is formed with first and second opening portions 26 and 27. The first opening portion 26 is continuously formed on the entire surface of the D-type NMOSFET region 22. More specifically, the first opening portion 26 is formed over the range from part of the STI 21 provided around the region 22, for example, the end of the region 22 to the approximately central portion of the STI 21. The second opening portion 27 is formed at the position corresponding to part of the STI 21 provided around the E-type NMOSFET region 23, for example, the approximately central portion of the STI 21. The same conductivity type as the substrate 20, that is, P-type impurity ion, for example, boron ion ($B^+$) is implanted using the resist layer 25 as a mask. By doing so, an ion implantation region 28 for field implantation is formed. In the ion implantation, ion implantation condition such as ion acceleration energy is set. According to the ion implantation condition, boron ion ($B^+$) passes through the STI 21, and reaches the bottom surface of the STI 21. The peak of impurity profile of the implanted boron ion is situated in the substrate 20 under the bottom surface of the STI 21, as seen from FIG. 4.

Figure 3C:
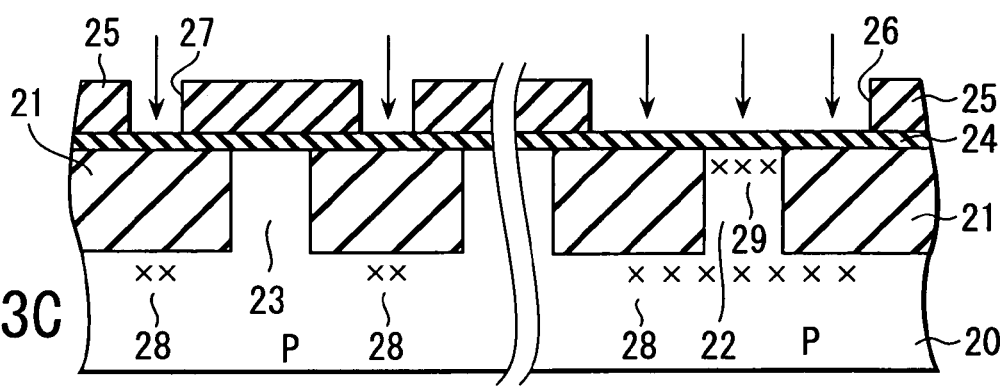

As depicted in FIG. 3C, opposite conductivity type to the substrate 20, that is, N-type impurity ion, for example, phosphorus ion ($P^+$) is implanted using the resist layer 25 used in the process of FIG. 3B. By doing so, the D-type NMOSFET region 22 is formed with an ion implantation region 29 for controlling threshold voltage of the D-type NMOSFET, that is, channel implantation. In the ion implantation, ion implantation condition such as ion acceleration energy is set. According to the ion implantation condition, the peak of impurity profile of the implanted phosphorus ion ($P^+$) is situated on the midway of the depth direction of the STI 21, as seen from FIG. 4.

Figure 3D:
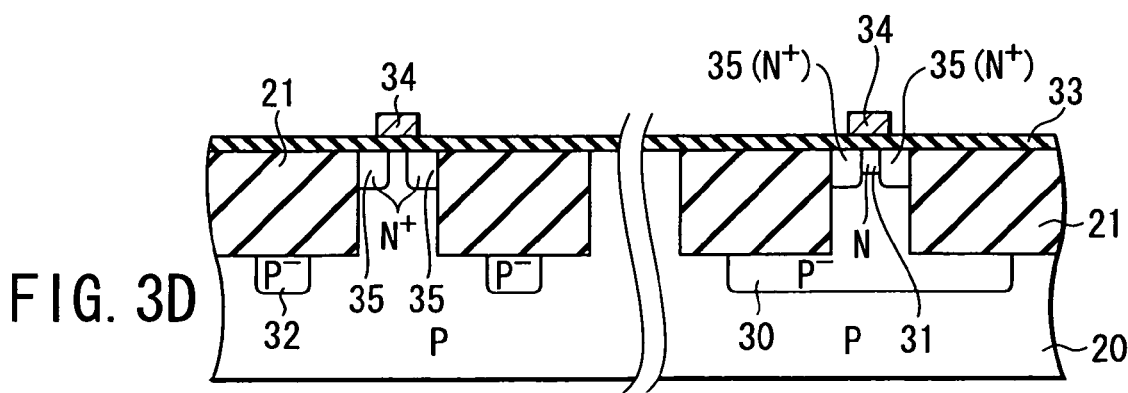

Then, the resist layer 25 is removed, and thereafter, heat treatment is carried out so that ion implantation regions 28 and 29 can be activated as shown in FIG. 3D. Thus, a $P^-$-type channel stopper region 30 is formed at the D-type NMOSFET region 22 and around there while an N-type channel region 31 is formed in the surface of the D-type NMOSFET region 22. The bottom of the STI 21 provided around the E-type NMOSFET region 23 is formed with a $P^-$-type channel stopper region 32. Further, a gate insulating film, for example, silicon oxide film 33 is newly deposited on the entire surface. A gate conductive film, for example, polycrystalline silicon film is deposited on the silicon oxide film 33. The polycrystalline silicon film is patterned by the PEP so that a gate electrode 34 is formed on each of D-type and E-type NMOSFET regions 22 and 23. N-type impurity is introduced into D-type and E-type NMOSFET regions 22 and 23 using each gate electrode 23 as a mask. The N-type impurity is diffused, and thereby, $N^+$-type source/drain regions 35 are formed.

In the channel implantation carried out in the process of FIG. 3C, phosphorus ion ($P^+$) is implanted at low acceleration energy. Thus, the phosphorus ion collects in the STI 21 without passing through the STI 21 in the E-type NMOSFET region 23. Therefore, no influence is given to the impurity concentration profile of the channel stopper region 32. As a result, it is possible to prevent an increase of leak current between fields resulting from the scale-down of MOSFET and a reduction of junction breakdown voltage. Accordingly, there is no possibility of causing the reduction of isolation ability.

The characteristic of gate voltage Vg to drain current Id of the E-type MOSFET formed in the foregoing manner was simulated. As a result, no reduction of the characteristic was found.

Incidentally, any other forms may be used as the impurity ion for threshold control so long as they do not pass through the STI 21. Different kind may be used between impurity ions for threshold control and field implantation. As described in the first embodiment, boron may be used as the first impurity ion, and phosphorus may be used as the second impurity ion.

According to the foregoing method, channel and field implantations are carried out using the same resist layer formed in one-time PEP in order to form the following NMOSFETs. One is a D-type NMOSFET having low breakdown voltage of about 4 V formed in the D-type NMOSFET region 22. Another is an E-type NMOSFET having high breakdown voltage of about 30 V formed in the E-type NMOSFET region 23.

In other words, channel and field implantations are carried out using the same resist layer formed in one-time PEP every MOSFET group having different threshold voltage. Therefore, it is possible to omit the conventionally required process of forming/removing the mask for channel implantation only, and thus, to reduce the manufacture cost.

The first embodiment has explained about the case where field implantation is carried out, and thereafter, channel implantation is carried out. The following modification may be made, that is, channel implantation is first carried out, and thereafter, field implantation is carried out. In this case, the mask used for the foregoing both implantations is, of course, the same.

Different thickness may be used between gate insulating films forming high breakdown voltage E-type MOSFET formed in the E-type NMOSFET region 23 and forming D-type MOSFET formed in the D-type NMOSFET region 22. In order to realize breakdown voltage required for the high breakdown voltage E-type MOSFET formed in the E-type NMOSFET region 23, the following measures are taken. More specifically, the E-type MOSFET has a gate insulating film thicker than the D-type MOSFET formed in the D-type NMOSFET region 22. By doing so, a desired breakdown voltage is realized, and thus, it is further effective.

In addition, different impurity concentration and kind may be used between source/drain diffusion layers 35 forming high breakdown voltage E-type MOSFET formed in the E-type NMOSFET region 23 and forming D-type MOSFET formed in the D-type NMOSFET region 22. For example, in order to realize breakdown voltage required for the high breakdown voltage E-type MOSFET formed in the E-type NMOSFET region 23, the following measures are taken. More specifically, the source/drain region of the E-type MOSFET has impurity concentration low than that of the D-type MOSFET formed in the D-type NMOSFET region 22. By doing so, a desired breakdown voltage is realized.

Second Embodiment

In the second embodiment, field and channel implantations for each of E-type NMOSFET, high and low breakdown voltage D-type NMOSFETs are carried out using the resist layer prepared in one-time PEP based on the first embodiment.

Figure 5:
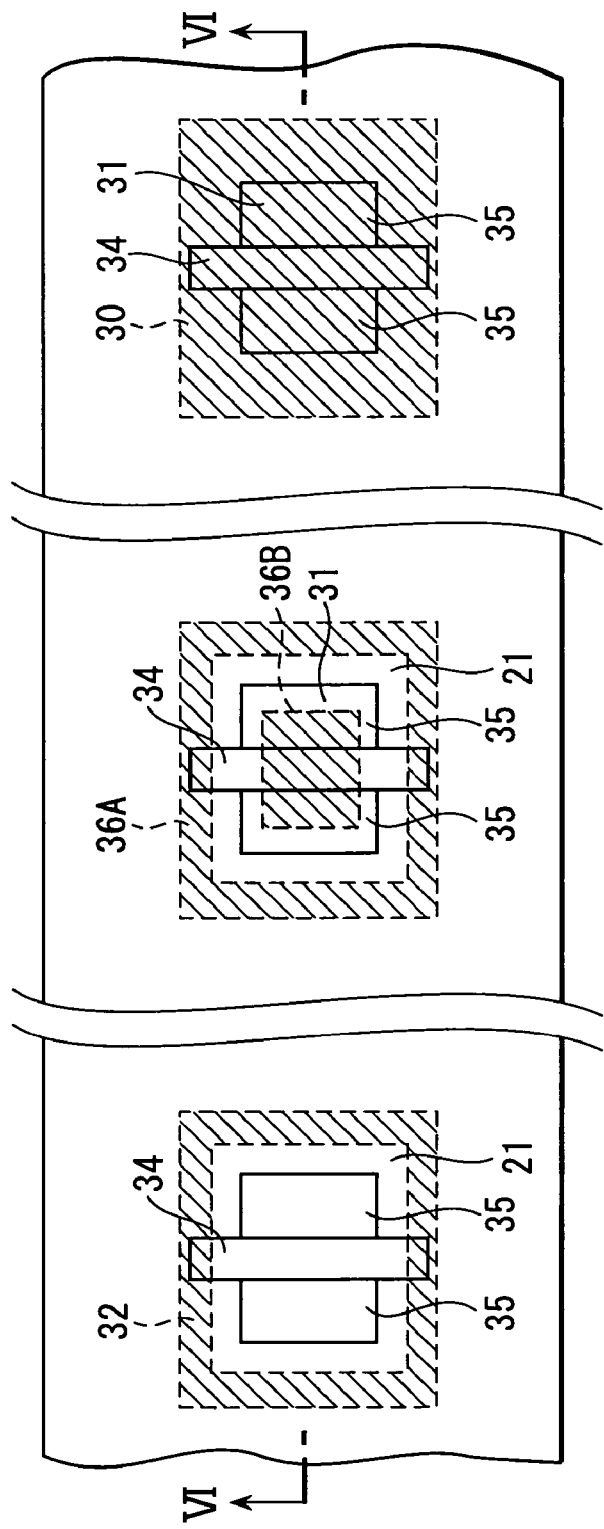
FIG. 5 is a partially transparent plan view showing each pattern layout of three kinds of MOSFETs in a semiconductor device according to a second embodiment of the present invention.
Figure 6:
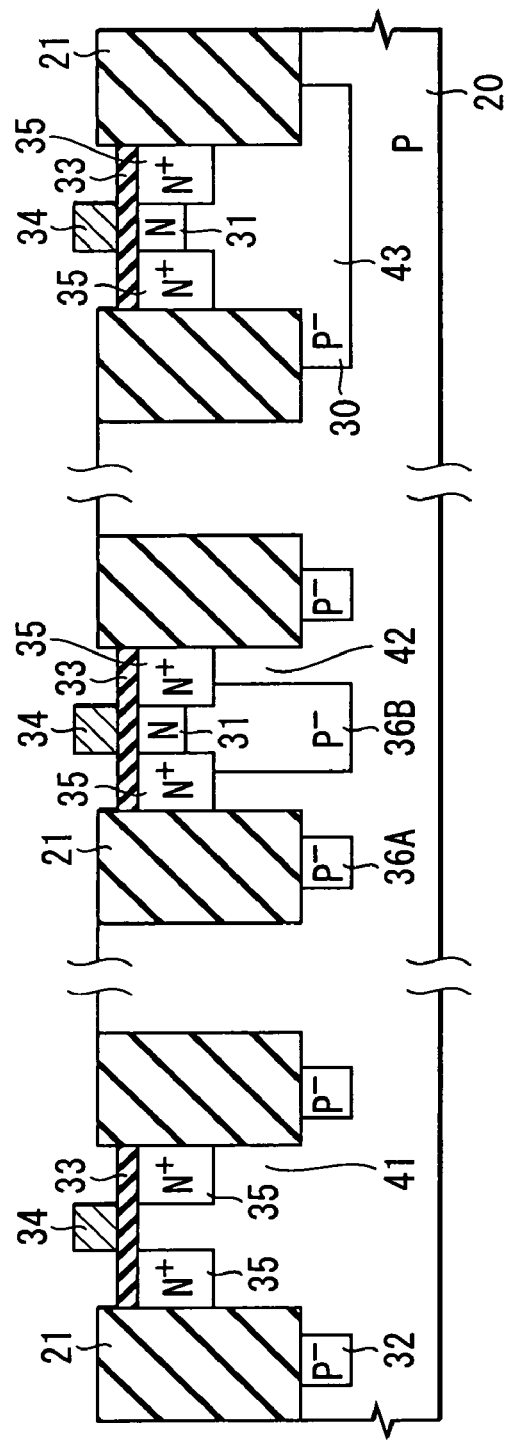
FIG. 6 is a cross sectional view showing three MOSFETs shown in FIG. 5.

FIG. 5 is a partially transparent plan view schematically showing the pattern layout of individual MOSFETs described above. FIG. 6 is a cross sectional view showing MOSFETs shown in FIG. 5. In FIG. 5 and FIG. 6, the same reference numerals are given to designate portions corresponding to FIG. 3A to FIG. 3D, and the details are omitted.

In FIG. 6, reference numerals 41, 42 and 43 denote E-type NMOSFET region, high and low breakdown voltage D-type NMOSFET regions, which are formed of the substrate 20 surrounded by the STI 21, respectively. The E-type NMOSFET formed in the E-type NMOSFET region 41 and the low breakdown voltage D-type NMOSFET formed in the D-type NMOSFET region 43 has the same structure as each NMOSFET shown in FIG. 3D of the first embodiment.

The high breakdown voltage D-type NMOSFET differs from the low breakdown voltage D-type NMOSFET in the following point. More specifically, the channel stopper region is separated into channel stopper regions 36A and 36B. The channel stopper region 36A is situated under the central bottom surface of the STI 21. On the other hand, the channel stopper region 36B is formed below the D-type NMOSFET region 42. In other words, a gap exists between the channel stopper region 36A and the source/drain region 35, and other structure is the same. The low breakdown voltage D-type NMOSFET has the structure of realizing threshold voltage higher than the high breakdown voltage D-type NMOSFET.

In the process of manufacturing the MOSFETs, the resist layer used as the ion implantation mask for channel and field implantations is as follows. The resist layer has the same plan pattern as the first embodiment described in FIG. 3A and FIG. 3B in E-type NMOSFET region 41 and low breakdown voltage D-type NMOSFET region 43. The resist layer used in the high breakdown voltage D-type NMOSFET region 42 has opening portions corresponding to channel stopper regions 36A and 36B.

In this case, channel and field implantations for three kinds of MOSFETs are carried out using the mask layer formed at one-time PEP. Therefore, it is possible to omit the conventionally required process of forming/removing the mask for channel implantation only, and thus, to reduce the manufacture cost.

Modification Example of the First Embodiment

In the first embodiment, the high breakdown voltage D-type NMOSFET of the second embodiment is manufactured in place of the low breakdown voltage D-type NMOSFET. In other words, field and channel implantations for E-type NMOSFET and high breakdown voltage D-type NMOSFET are carried out using one mask layer formed at one-time PEP. In also case, the same effect as the first embodiment is obtained.

Third Embodiment

Figure 7:
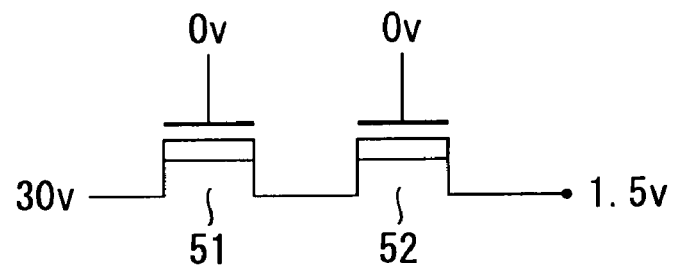
FIG. 7 is a diagram showing an equivalent circuit of a semiconductor device according to a third embodiment of the present invention.

FIG. 7 shows an equivalent circuit of a semiconductor device in which two D-type NMOSFETs having different breakdown voltage are cascade-connected.

Here, high voltage of about 30 V is applied to the drain region of a high breakdown voltage D-type NMOSFET 51 while low voltage of about 1.5 V is applied to the source region of a low breakdown voltage D-type NMOSFET 52. FIG. 7 shows the mode of breaking current flowing from high voltage toward low voltage in a state that 0 V bias is applied to each gate of NMOSFETs.

Figure 8:
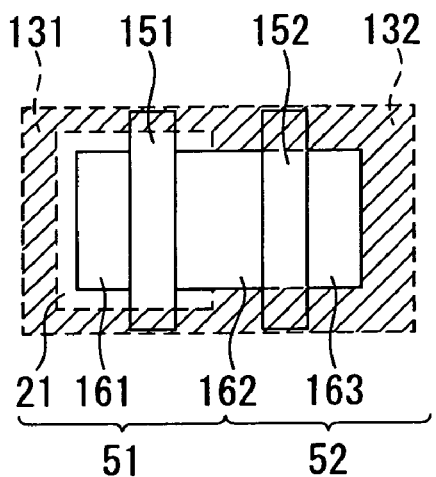
FIG. 8 is a plan view showing the pattern layout of the semiconductor device shown in FIG. 7.

FIG. 8 shows the plan pattern of the circuit shown in FIG. 7. High and low breakdown voltage D-type NMOSFETs 51 and 52 are formed adjacent to each other in one D-type NMOSFET region having a semiconductor substrate surrounded by the STI 21. In FIG. 8, a reference numeral 151 denotes a gate electrode of the high breakdown voltage D-type NMOSFET 51, and 161 denotes a drain region of the NMOSFET 51. A reference numeral 162 denotes a commonly used region for a source region of the NMOSFET 51 and a drain region of the low breakdown voltage D-type NMOSFET 52. A reference numeral 152 a gate electrode of the low breakdown voltage D-type NMOSFET 52, and 163 denotes a source region thereof.

The high breakdown voltage D-type NMOSFET 51 is formed with a field implantation region 131. The field implantation region 131 is formed at the position separating from the source/drain region under the central bottom surface of the STI 21 as seen from the slanted line of FIG. 8. On the other hand, the low breakdown voltage D-type NMOSFET 52 is formed with a field implantation region 132. The field implantation region 132 is formed at the position adjacent to the source/drain region under the central bottom surface of the STI 21, as seen from the slanted line of FIG. 8.

For example, under the gate electrode 151 of the high breakdown voltage D-type NMOSFET 51, there is provided a gate insulating film made of silicon oxide film, as seen from FIG. 6. Likewise, under the gate electrode 152 of the low breakdown voltage D-type NMOSFET 52, there is provided a gate insulating film made of silicon oxide film. The gate insulating film under the gate electrode 152 is formed thinner than that under the gate electrode 151.

In order to realize the circuit shown in FIG. 7, the following process must be carried out in the conventional case. More specifically, the process of forming high and low breakdown voltage D-type NMOSFETs 51 and 52 is separately carried out. Thereafter, the source region of the high breakdown voltage D-type NMOSFET 51 and the drain region of the low breakdown voltage D-type NMOSFET 52 are connected using interconnects.

On the contrary, the semiconductor device having the pattern shown in FIG. 8 has the effect of reducing the number of PEP and the occupied area, that is, pattern occupied area.

Fourth Embodiment

The first embodiment has explained about the case where the gate oxide film and the gate electrode conductor film are deposited in the second half of the process. On the contrary, in the fourth embodiment, the foregoing gate oxide film and gate electrode conductor film are deposited in the initial stage of the process. Similarly to the first embodiment, the case of manufacturing the semiconductor device in which having E-type and D-type NMOSFETs are formed in the same substrate will be given as one example.

Figure 9A:
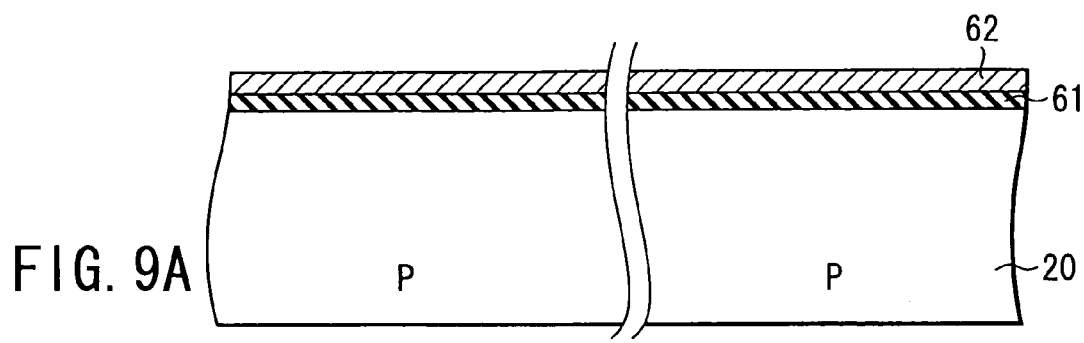
FIG. 9A to FIG. 9E are cross-sectional views showing the process of manufacturing a semiconductor device according to a fourth embodiment of the present invention.

As shown in FIG. 9A, a gate oxide film 61 having a thickness of 10 nm is deposited on the surface of the P-type semiconductor substrate (semiconductor layer) 20 under dry atmosphere of 800° C. Thereafter, a polycrystalline silicon layer 62 having a thickness of 50 nm is deposited by LP-CVD (low pressure CVD). Phosphorous (P) is doped as impurity in the deposition of the polycrystalline silicon layer 62; therefore, the polycrystalline silicon layer 62 has low resistance.

Figure 9B:
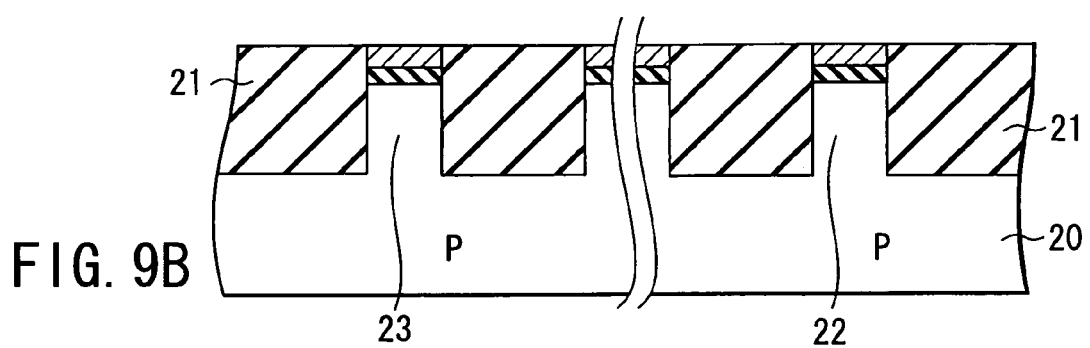

Then, the polycrystalline silicon layer 62, and the gate oxide film 61 and the semiconductor substrate 20 meneath the layer 62 are selectively etched, whereby shallow trenches are formed in a surface region of the semiconductor substrate 20. An insulating film, for example, silicon oxide film ($SiO_2$ film) is deposited on the entire surface so that the trenches are filled, as shown in FIG. 9b. The insulating film is removed using chemical and mechanical polishing (CMP), and thereby, the surface is planarized. Thus, several STIs 21 in which the trench is filled with the insulating film are formed as seen from FIG. 9B. In forming the trenches, the trenches are formed to be self-aligned with respect to the polycrystalline silicon layer 62 and the gate insulating film 61.

In FIG. 9B, the right-hand side shows a state that a D-type NMOSFET region 22 is formed of the substrate 20 surrounded by the STI 21. On the other hand, the left-hand side shows a state that an E-type NMOSFET region 23 is formed of the substrate 20 surrounded by the STI 21.

Figure 9C:
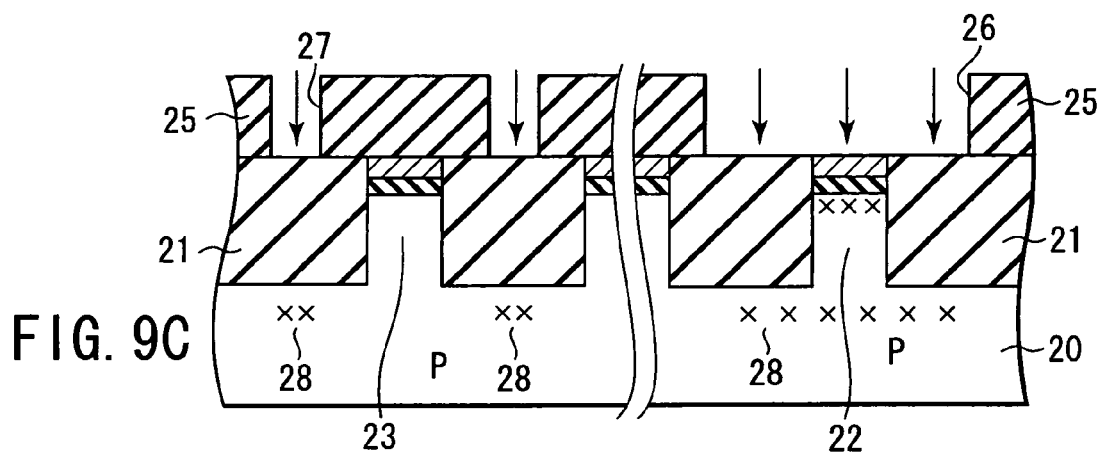

As illustrated in FIG. 9C, an ion implantation mask is formed by the foregoing PEP. For example, a resist layer 25 is formed as the mask. The resist layer 25 is formed with first and second opening portions 26 and 27. The first opening portion 26 is continuously formed on the entire surface of the D-type NMOSFET region 22. More specifically, the first opening portion 26 is formed over the range from part of the STI 21 provided around the region 22, for example, the end of the region 22 to the approximately center portion of the STI 21. The second opening portion 27 is formed at the position corresponding to part of the STI 21 provided around the E-type NMOSFET region 23, for example, the approximately center portion of the STI 21. The same conductivity type as the substrate 20, that is, P-type impurity, for example, boron ion ($B^+$) is implanted using the resist mask 25. By doing so, an ion implantation region 28 for field implantation is formed. In the ion implantation, ion implantation condition such as ion acceleration energy is set. According to the ion implantation condition, boron ion ($B^+$) passes through the STI 21, and reaches the bottom surface of the STI 21. The peak of impurity profile of the implanted boron ion is situated in the substrate 20 under the bottom surface of the STI 21, as seen from FIG. 4.

Figure 9D:
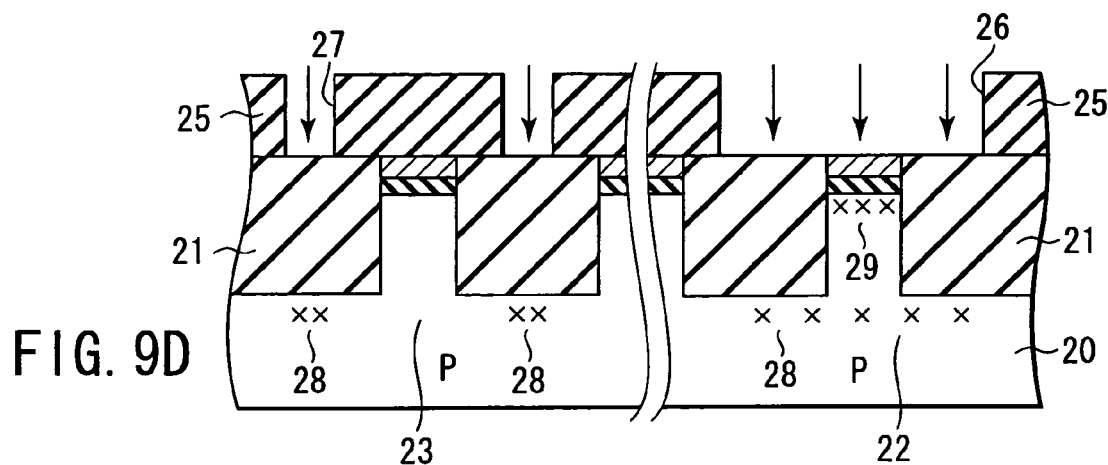

As depicted in FIG. 9D, the conductivity type opposite to the substrate 20, that is, N-type impurity ion, for example, phosphorus ion ($P^+$) is implanted using the resist layer 25 used in the process of FIG. 9C. By doing so, the threshold voltage of D-type NMOSFET formed in the D-type NMOSFET region 22 is controlled; in other words, an ion implantation region 29 for channel implantation is formed. In the ion implantation, ion implantation condition such as ion acceleration energy is set. According to the ion implantation condition, the peak of impurity profile of the implanted phosphorus ion ($P^+$) is situated on the midway of the depth direction of the STI 21, as seen from FIG. 4.

Figure 9E:
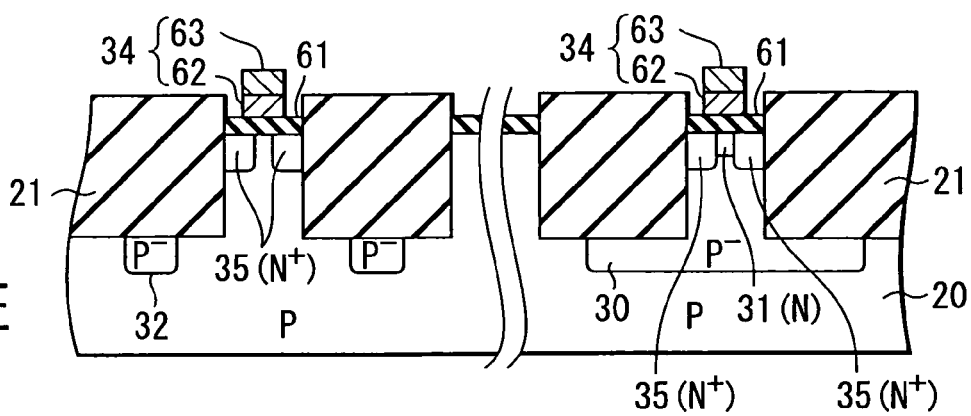

Then, the resist layer 25 is removed, and thereafter, heat treatment is carried out so that ion implantation regions 28 and 29 can be activated as shown in FIG. 9E. Thus, a $P^-$-type channel stopper region 30 is formed at the D-type NMOSFET 22 and around there while an N-type channel region 31 is formed in the surface region of the D type NMOSFET region 22. The bottom of the STI 21 provided around the E type NMOSFET region 23 is formed with a $P^-$-type channel stopper region 32. Further, a polycrystalline silicon film 63 is newly deposited on the entire surface. The polycrystalline silicon films 63 and 62 are patterned by the PEP so that a gate electrode 34 is formed on each of D type and E type NMOSFET regions 22 and 23. N type impurity is introduced into D type and E type NMOSFET regions 22 and 23 using each gate electrode 34 as a mask. The N type impurity is diffused, and thereby, $N^+$-type source/drain regions 35 are formed.

According to the fourth embodiment, field and channel implantations are carried out every MOSFET group having different threshold voltage using the same resist layer formed in the one-time PEP. Therefore, it is possible to omit the conventionally required process of forming/removing the mask for channel implantation only, and thus, to reduce the manufacture cost.

In the fourth embodiment, different thickness may be used between gate insulating films forming high breakdown voltage E-type MOSFET formed in the E-type NMOSFET region 23 and forming D-type MOSFET formed in the D-type NMOSFET region 22, like the first embodiment.

Different impurity concentration and kind may be used between source/drain diffusion layers 35 forming high breakdown voltage E-type MOSFET formed in the E-type NMOSFET region 23 and forming D-type MOSFET formed in the D-type NMOSFET region 22, like the first embodiment.

In the fourth embodiment, the gate insulating film and the gate electrode conductive film are deposited in the initial stage of the process, and thereafter, the STI 21 is formed. The document (T. Ukeda et. al., SSDM 1996, pp260-262) discloses the method of realizing high density and low price in manufacturing MOS-type semiconductor devices. According to the method, forming region and channel region of source/drain regions of MOS transistor are formed with part of gate electrode material. Thereafter, isolation region is formed to be self-aligned using the gate electrode material as a mask. Thus, in the fourth embodiment, element region and STI region are securely formed to be self-aligned. Consequently, it is possible to reduce influence by process variations, and to the minimum and high-density elements.

According to the fourth embodiment, a thin film is previously formed as the polycrystalline silicon film 62 before field and channel implantations are carried out. In order to pattern the gate electrode, another polycrystalline silicon film 63 is newly added and patterned. Thus, in channel implantation, impurity ion is implanted via the thin polycrystalline silicon film 62. Therefore, impurity implantation can be made at relatively low acceleration, and ion implantation variations by channeling can be reduced. The gate electrode 34 is formed of two layers, that is, polycrystalline silicon films 62 and 63. Therefore, the film is formed sufficiently thick; as a result, there is no increase of the gate resistance.

Fifth Embodiment

The fourth embodiment has explained about the case where field and channel implantations are carried out after the STI 21 is formed. On the contrary, in the fifth embodiment, the STI 21 is formed after field and channel implantations are carried out. The method according to the fifth embodiment will be described below with reference to FIG. 10A to FIG. 10F.

Figure 10A:
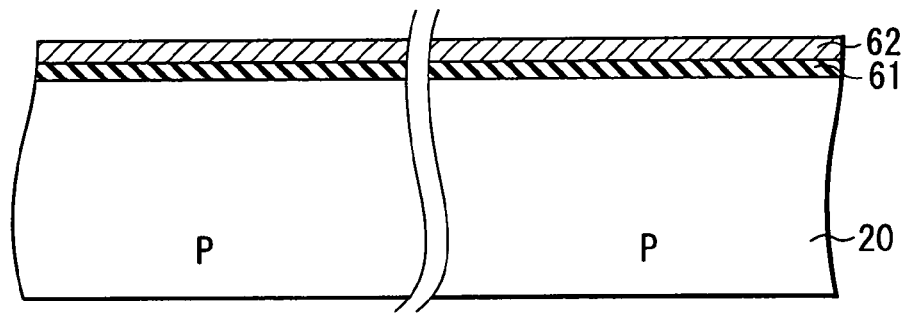
FIG. 10A to FIG. 10F are cross-sectional views showing the process of manufacturing a semiconductor device according to a fifth embodiment of the present invention.

As shown in FIG. 10A, the gate oxide film 61 is deposited on the surface of the P-type semiconductor substrate (semiconductor layer) 20, thereafter, the polycrystalline silicon layer 62 is deposited, like the process of FIG. 9A. Phosphorous (P) is doped as impurity in the deposition of the polycrystalline silicon layer 62 so that the polycrystalline silicon layer 62 has low resistance.

Figure 10B:
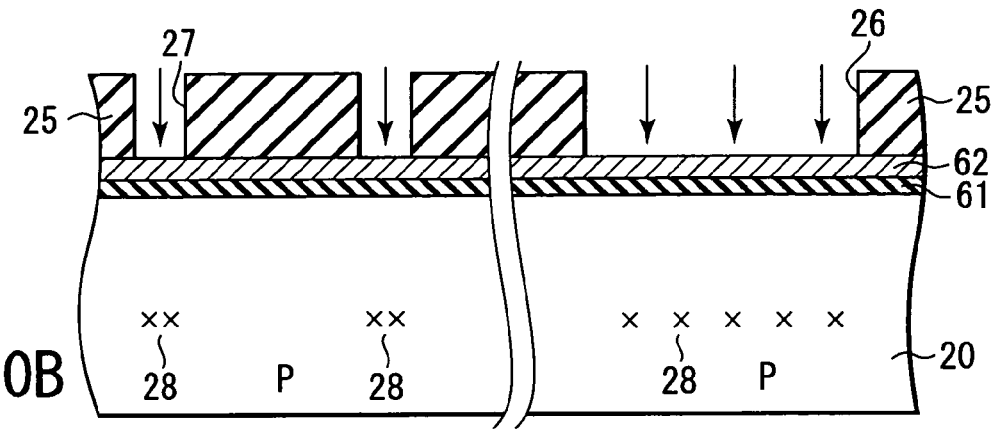

As illustrated in FIG. 10B, the resist layer 25 having the same pattern as formed in the process of FIG. 9B is formed. The same conductivity type as the substrate 20, that is, P-type impurity, for example, boron ion ($B^+$) is implanted using the resist mask 25. By doing so, an ion implantation region 28 for field implantation is formed. In the ion implantation, ion implantation condition such as ion acceleration energy is set. According to the ion implantation condition, the peak of impurity profile of the implanted boron ion is situated in the substrate 20 under the bottom surface of an STI, which will be formed in the later process.

Figure 10C:
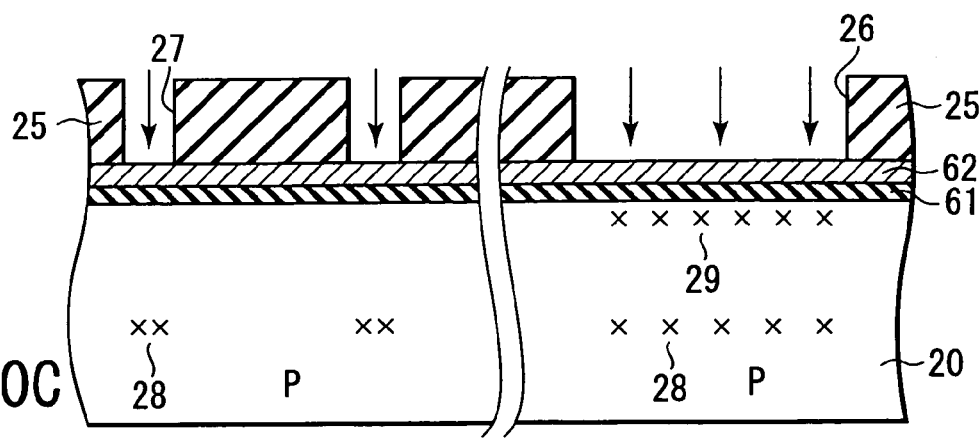

As depicted in FIG. 10C, the conductivity type opposite to the substrate 20, that is, N-type impurity ion, for example, phosphorus ion ($P^+$) is implanted using the resist layer 25 used in the process of FIG. 10B. By doing so, the threshold voltage of D-type NMOSFET formed in the D-type NMOSFET region 22 is controlled; in other words, an ion implantation region 29 for channel implantation is formed. In the ion implantation, ion implantation condition such as ion acceleration energy is set. According to the ion implantation condition, the peak of impurity profile of the implanted phosphorus ion ($P^+$) is situated on the midway of the depth direction of the STI, which will be formed in the later process.

Figure 10D:
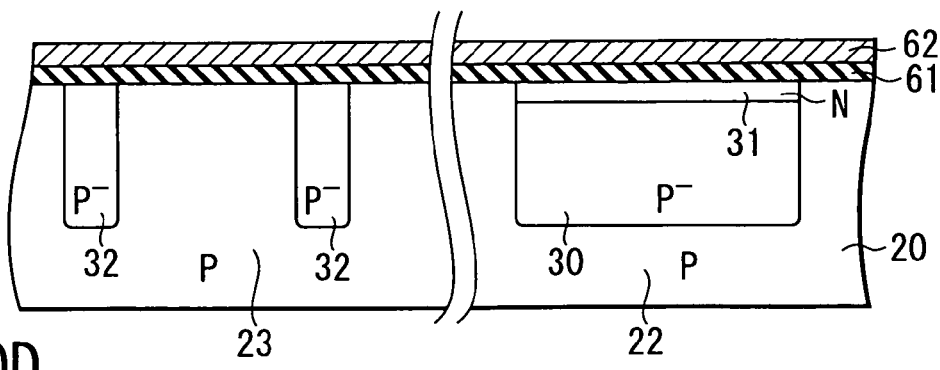
Figure 10E:
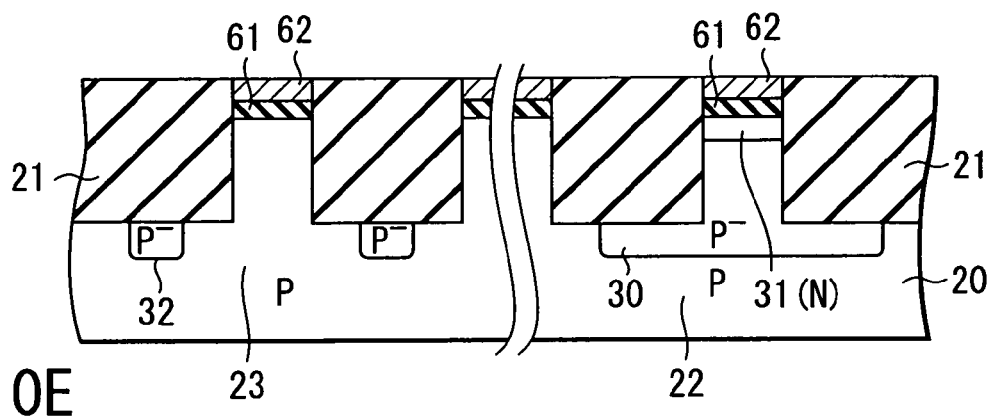

Then, the resist layer 25 is removed, and thereafter, heat treatment is carried out so that ion implantation regions 28 and 29 can be activated as shown in FIG. 10D. Thus, a $P^-$ type channel stopper region 30 is formed at the D-type NMOSFET 22 and around there while an N-type channel region 31 is formed in the surface region of the D-type NMOSFET region 22. A $P^-$ type channel stopper region 32 is formed around the E-type NMOSFET region 23.

Then, the polycrystalline silicon layer 62, the gate oxide film 61 and the semiconductor substrate 20 under those are selectively etched, shallow trenches are formed in the surface region of the semiconductor substrate 20. An insulating film, for example, a silicon oxide film ($SiO_2$ film) is deposited on the entire surface so that the trenches are filled. The insulating film is removed using chemical and mechanical polishing (CMP), and thereby, the surface is planarized. Thus, several STIs 21 in which the trench is filled with the insulating film are formed as seen from FIG. 10E.

Figure 10F:
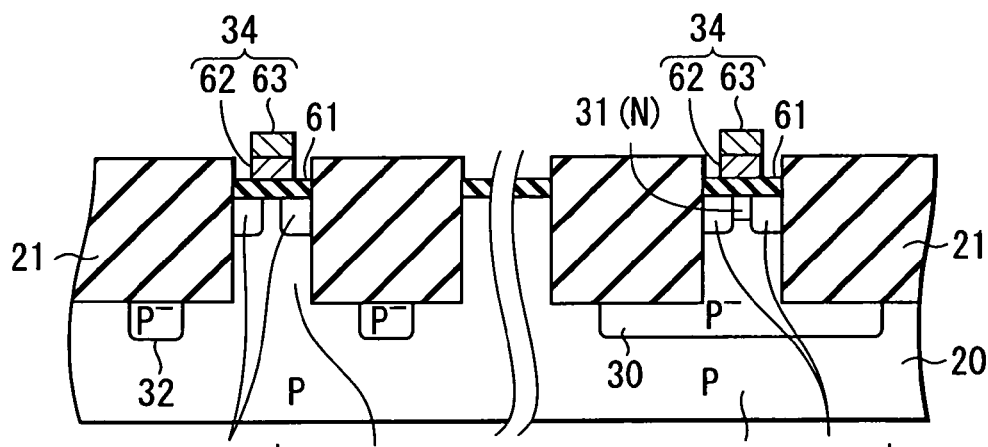

Thereafter, the polycrystalline silicon film 63 is newly deposited on the entire surface. The polycrystalline silicon films 63 and 62 are patterned by the PEP so that a gate electrode 34 is formed on each of D type and E type NMOSFET regions 22 and 23. An N type impurity is introduced into D type and E type NMOSFET regions 22 and 23 using each gate electrode 34 as a mask. The N type impurity is diffused, and thereby, $N^+$-type source/drain regions 35 are formed as shown in FIG. 10F.

In the fifth embodiment, the same effect as the fourth embodiment is obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming an isolation region in a surface region of a first conductivity type semiconductor layer to form a MOS type element region having the semiconductor layer surrounded by the isolation region;

forming a mask layer having an opening portion on the semiconductor layer, the opening portion continuously ranging on the entire surface of the MOS type element region and on part of the isolation region provided around the MOS type element region;

implanting a first impurity ion having a first conductivity type into the entire surface using the mask layer as a mask to set a peak of impurity profile situated in the semiconductor layer under a bottom surface of the isolation region;

implanting a second impurity ion having a second conductivity type which is different than the first conductivity type into the entire surface using the mask layer as a mask to set a peak of the impurity profile situated midway of a depth direction of the isolation region; and activating the first and second impurity ions to form a channel stopper region and a channel region.

2. The method according to claim 1, wherein the isolation region is a shallow trench isolation region.

3. The method according to claim 1, wherein the first conductivity type is a P-type, and the conductivity type of the first impurity ion is a P-type while the conductivity type of the second impurity ion is an N-type.

4. The method according to claim 3, wherein the first impurity ion is boron ion, and the second impurity ion is phosphorus ion.

5. The method according to claim 1, further comprising: forming a gate electrode on the MOS type element region; and forming a drain/source region of MOS type element in a surface region of the MOS type element region in a self-aligned manner with the gate electrode.

6. A method of manufacturing a semiconductor device, comprising:
   forming first and second isolation regions in a surface region of a first conductivity type semiconductor layer to form a first MOS type element region having the semiconductor layer surrounded by a first trench isolation region and a second MOS type element region having the semiconductor layer surrounded by a second trench isolation region;
   forming a mask layer having first and second opening portions on the semiconductor layer, the first opening portion continuously ranging on the entire surface of the first MOS type element region and on part of the first trench isolation region provided around the first MOS type element region, the second opening portion being formed at a position corresponding to approximately a central region of the second trench isolation region provided around the second MOS type element region;
   implanting a first impurity ion having the first conductivity type into the entire surface using the mask layer as a mask to set a peak of impurity profile is situated in the semiconductor layer under a bottom surface of the first and second trench isolation regions;
   implanting a second impurity ion having a second conductivity type which is different than the first conductivity type into the entire surface using the mask layer as a mask to set a peak of the impurity profile situated midway of a depth direction of the first and second trench isolation regions; and
   activating the first and second impurity ions to form a channel stopper region and a channel region.

7. The method according to claim 6, wherein each of the first and second isolation regions is a shallow trench isolation region.

8. The method according to claim 6, wherein the first conductivity type is a P-type, and the conductivity type of the first impurity ion is a P-type while the conductivity type of the second impurity ion is an N-type.

9. The method according to claim 8, wherein the first impurity ion is boron ion, and the second impurity ion is phosphorus ion.

10. The method according to claim 6, further comprising: forming a first gate electrode on the first MOS type element region while forming a second gate electrode on the second MOS type element region; and forming drain/source regions of first MOS type element in the surface region of the first MOS type element region in a self-aligned manner with the first gate electrode while forming drain/source regions of second MOS type element in the surface region of the second MOS type element region in a self-aligned manner with the second gate electrode.

11. A method of manufacturing a semiconductor device, comprising:
   successively depositing a gate oxide film and a conductive film on the entire surface of a first conductivity type semiconductor layer;
   selectively removing the gate oxide film, the conductive film and the semiconductor layer, and forming trench buried type first and second isolation regions filled with an insulating film to form a first MOS type element region including the semiconductor layer surrounded by the first isolation region while forming a second MOS type element region including the semiconductor layer surrounded by the second isolation region;
   forming a mask layer having first and second opening portions on the semiconductor layer, the first opening portion being continuously formed over the entire surface of the first MOS type element region and part of the first isolation region provided around the first MOS type element region, the second opening portion being formed at a position corresponding to approximately a center portion of the second isolation region provided around the second MOS type element region;
   implanting a first impurity ion having a first conductivity type into the entire surface using the mask layer as a mask to set a peak of impurity profile situated in the semiconductor layer under a bottom surface of the first and second isolation regions;
   implanting a second impurity ion having a second conductivity type which is different than the first conductivity type into the entire surface using the mask layer as a mask to set a peak of impurity profile situated midway of a depth direction of the first and second isolation regions; and
   activating the first and second impurity ions to form a channel stopper region and a channel region.

12. The method according to claim 11, wherein when the first and second MOS type element regions are formed, the gate oxide film and the semiconductor layer are selectively removed to pattern the gate oxide film and the semiconductor layer, and the first and second MOS type element regions are formed to be self-aligned with respect to the patterned gate oxide film and semiconductor layer.

13. The method according to claim 11, further comprising: patterning the conductive film remaining on the first and second MOS type element regions to form a gate electrode on each of the first and second MOS type element regions; and implanting a third impurity ion using the gate electrode as a mask to form source/drain regions at each of the first and second MOS type element regions.

14. The method according to claim 11, wherein the first and second isolation regions are individually shallow trench isolation regions.

15. The method according to claim 11, wherein the first conductivity type is a P-type, and the conductivity type of the first impurity ion is a P-type while the conductivity type of the second impurity ion is an N-type.

16. The method according to claim 11, wherein the first impurity ion is boron, and the second impurity ion is phosphorus ion.

17. A method of manufacturing a semiconductor device, comprising:
   successively depositing a gate oxide film and a conductive film on the entire surface of a first conductivity type semiconductor layer;
   forming a mask layer having first and second opening portions on the semiconductor layer, the first opening portion being formed at a first MOS type element forming region, the second opening portion being formed at a second MOS type element forming region surrounding an element forming region;

implanting a first impurity ion having a first conductivity type into the entire surface using the mask layer as a mask to set a peak of impurity profile situated at a first depth;

implanting a second impurity ion having a second conductivity type which is different than the first conductivity type into the entire surface using the mask layer as a mask to set a peak of impurity profile situated at a second depth shallower than the first depth;

activating the first and second impurity ions to form a channel stopper region and a channel region; and selectively removing the gate oxide film, the conductive film and the semiconductor layer, and forming a trench buried type first isolation region filled with an insulating film around the first MOS type element forming region while forming a trench buried type second isolation region filled with an insulating film around the second MOS type element forming region.

* * * * *